United States Patent
Schaefer et al.

(10) Patent No.: US 10,753,984 B2
(45) Date of Patent: Aug. 25, 2020

(54) METHOD AND MEASUREMENT ARRANGEMENT FOR MONITORING A PRODUCTION PROCESS OF A MODULARLY SET-UP VOLTAGE SOURCE

(71) Applicant: Bender GmbH & Co. KG, Gruenberg (DE)

(72) Inventors: Oliver Schaefer, Gruenberg (DE); Burkhard Macht, Hungen (DE); Frank Mehling, Ranstadt (DE); Steffen Kreuder, Gruenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 84 days.

(21) Appl. No.: 15/986,959

(22) Filed: May 23, 2018

(65) Prior Publication Data

US 2018/0348282 A1 Dec. 6, 2018

(30) Foreign Application Priority Data

May 31, 2017 (DE) .......................... 10 2017 209 243

(51) Int. Cl.
*G01R 31/50* (2020.01)
*H01M 10/42* (2006.01)
(Continued)

(52) U.S. Cl.
CPC ......... *G01R 31/50* (2020.01); *G01R 27/2605* (2013.01); *H01M 10/4285* (2013.01);
(Continued)

(58) Field of Classification Search
CPC .. G01R 31/025; G01R 27/2605; G01R 31/40; H01M 10/4285; H01M 2/0285; H01M 10/48
See application file for complete search history.

(56) References Cited

U.S. PATENT DOCUMENTS 5,272,440 A * 12/1993 Weynachter ........... G01R 25/00
324/510
5,475,558 A * 12/1995 Barjonnet ............ G01R 31/025
361/64
(Continued)

FOREIGN PATENT DOCUMENTS

CN 202614911 U 12/2012
CN 103098258 A 5/2013
(Continued)

OTHER PUBLICATIONS

English Abstract of CN202614911U dated Dec. 19, 2012.
(Continued)

*Primary Examiner* — Tung X Nguyen
*Assistant Examiner* — Feba Pothen
(74) *Attorney, Agent, or Firm* — King & Schickli, PLLC

(57) ABSTRACT

A pallet understructure, in particular for transport and storage containers for liquids, which are equipped with an inner container made of plastic, with a closable filling neck and a draining neck for connecting a tapping armature, wherein the understructure has an outer jacket made of a metal grid or sheet metal, and a bottom (13) for supporting the inner container, corner feet and central feet arranged between the corner feet, as well as a bottom cross member (16), wherein at least the outer jacket and the bottom cross member are attached to at least two central feet, wherein the respective central foot, the outer jacket and the bottom cross member are coupled in a form-fitting fashion with the aid of a screw (45), wherein there is a bracket (28), which reaches around the bottom cross member (16) and around a peripheral edge of the outer jacket, wherein the screw (45) penetrates legs (29, 30) of the bracket.

19 Claims, 4 Drawing Sheets

Figure 1:
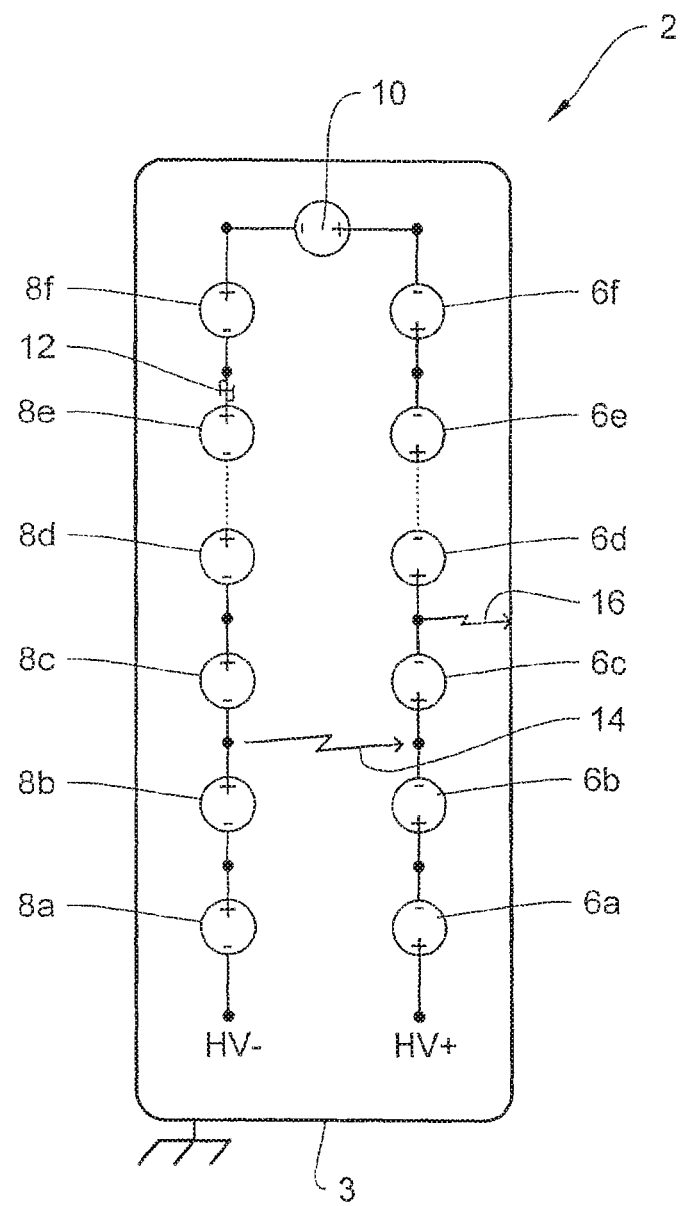

(51) Int. Cl.
    *G01R 27/26*     (2006.01)
    *G01R 31/40*     (2020.01)
    *H01M 2/02*     (2006.01)
    *H01M 10/48*     (2006.01)

(52) U.S. Cl.
    CPC .......... *G01R 31/40* (2013.01); *H01M 2/0285* (2013.01); *H01M 10/482* (2013.01)

(56) References Cited

U.S. PATENT DOCUMENTS

| | | | |
|---|---|---|---|
| 2011/0049977 A1* | 3/2011 | Onnerud | B60L 3/0046 307/9.1 |
| 2015/0077130 A1* | 3/2015 | Hackl | G01R 19/0092 324/522 |
| 2015/0309106 A1* | 10/2015 | Machida | G01R 31/025 324/509 |

FOREIGN PATENT DOCUMENTS

| | | |
|---|---|---|
| CN | 104795604 A | 7/2015 |
| CN | 105958104 A | 9/2016 |
| CN | 205646041 U | 10/2016 |
| CN | 106680721 A | 5/2017 |
| DE | 102014101728 A1 | 8/2014 |
| DE | 102013013950 A1 | 2/2015 |
| DE | 102014003325 A1 | 9/2015 |
| DE | 102014003910 A1 | 9/2015 |
| EP | 2978063 A1 | 9/2014 |
| TW | 201223070 A | 6/2012 |

OTHER PUBLICATIONS

English Abstract of CN104795604A dated Jul. 22, 2015.
English Abstract of CN105958104A dated Sep. 21, 2016.
English Abstract of CN103098258A dated May 8, 2013.
English Abstract of CN205646041U dated Oct. 12, 2016.
English Abstract of CN106680721A dated May 17, 2017.
English Abstract of TW201223070A dated Jun. 6, 2012.

* cited by examiner

METHOD AND MEASUREMENT ARRANGEMENT FOR MONITORING A PRODUCTION PROCESS OF A MODULARLY SET-UP VOLTAGE SOURCE

This application incorporates by reference the disclosure of German Patent Application no. 10 2017 209 243.2, filed May 31, 2017.

TECHNICAL FIELD

The invention relates to a method and a measuring arrangement for monitoring a production process of a voltage source, which consists of modules connected in series and having an electrically conductive casing, said modules being set up step-by-step during the production process starting from a first connection to form a first partial string of the module and starting from a second connection to form a second partial string of the module and a lastly installed module connecting both partial strings of the modules to each other to form a closed module string.

BACKGROUND

In the course of making regenerative energy sources available, more and more questions regarding a rational production of electric storage media and voltage sources, in particular high-voltage batteries (HV batteries) for electric vehicles or module strings for photovoltaic plants (PV plants), are moving to the forefront.

As an exemplary application of a production process based on the invention, the assembly process of HV batteries and of photovoltaic module strings is described first of all.

HV batteries for electric vehicles consist of individual battery modules, which are automatically connected in series during production in order to attain the required high voltage.

For this purpose, the HV batteries are most commonly set up step-by-step during the production process to form a first partial string of a module starting from a first connection (positive pole HV+) and to form a second partial string of a module starting from a second connection (negative pole HV−), a lastly installed module connecting both partial strings of the modules to each other to form a closed module string. Therefore, not until the lastly installed battery module is installed can a voltage be measured between the positive pole and the negative pole. If produced correctly, this voltage should then correspond to the desired nominal voltage of the voltage source.

In comparison to a single-string assembly, lower voltages and shorter assembly times arise in this production process since two partial strings of the modules can be assembled at the same time.

Another application of a two-string production process is constituted by the installation of photovoltaic systems, individual solar panels being connected in series in order to ultimately form a module string. Since a central connection point exists at an inverter or at a sub-distribution board, the modules most commonly are also set up as two open partial strings starting from the positive pole and from the negative pole, respectively.

Not until the last module is installed will the series connection be closed, and the desired nominal voltage rests between the positive pole and the negative pole. As long as the modules are not connected to the inverter, the (partial) strings each form an independent ungrounded power supply system. Such an ungrounded power supply system is also referred to as an isolated network (IT network, from French Isolé Terre).

When producing HV batteries as well as when constructing photovoltaic plants and when producing modularly assembled voltage sources in general, two discrete ungrounded partial systems are therefore always yielded in the described production process, said partial systems not being connected to form one individual ungrounded overall system, which provides the required nominal voltage to the connecting terminals, until the last installed module is lastly installed.

During the production process, insulation faults or line defects (line breakage) can arise in individual modules or at the electrical connections, respectively, due to mechanical stresses or through external influences and can lead to considerable losses in quality or to the uselessness of the entire production unit. The installation of initially defective modules poses a source for error. These errors should be identified and localized as soon as possible in the progression of the production process since a fault location at the end of the assembly process is connected to a considerable expenditure of time and costs.

Constant insulation monitoring is a required normative measure in many applications during later operation in the fully installed voltage source (HV battery or photovoltaic plant), however, no such monitoring is intended during production.

It is known that when assembling HV batteries via optical process control and by using robots, an attempt at optimizing the production process is made in such a manner that the failure rate is as low as possible. Only at the end of the production process will the high voltage be tested and the insulation resistance measured.

When constructing photovoltaic plants, cables, which are resistant to short circuits and have plugs protected against polarity reversal, or standardized assembly sets are used due to structural features. Damage incurred during transport or assembly errors which effect electric parameters are not identified until after the inverter has been connected. The fault location is then quite difficult depending on the installation site and the size of the photovoltaic plant.

From the state of the art, a measuring method and an assembly device for insulation testing during assembly of a high voltage battery assembled from several battery modules are known from DE 10 2014 003 325 A1. When connecting the electrical connections between the battery modules of the high voltage battery, an electrically conductive assembly tool used therefor is connected to a measuring device testing the insulation resistance. The measured insulation resistance value is compared to a reference value and should an inadmissibly large difference between the reference value and the insulation resistance value be determined, a fault signal is triggered.

From DE 10 2014 003 910 A1, a testing device for simultaneously testing several battery cells is known and comprises a measuring device for detecting a leakage current, a series voltage, a through current and/or another battery parameter. For this purpose, the testing device comprises an access network, which comprises several contacting elements for being electrically contacted to poles of the battery cells as well as at least one current bridge for electrically connecting battery cells.

However, these known methods also often prove inadequate in regard of prematurely identifying assembly errors.

SUMMARY

The object of the invention at hand is therefore to propose a method and a device which enable identifying insulation faults and line defects occurring in a modularly set-up voltage source during the production process as soon as possible.

Starting from the aspect that when producing the voltage source, the modules are set up step-by-step starting from a first connection to form a first partial string of the module and starting from a second connection to form a second partial string of the module, a first coupling branch of a coupling circuit of an insulation monitoring devices is connected to the first connection of the first partial string of the module, a second coupling branch of the coupling circuit of the insulation monitoring device is connected to the second connection of the second partial string of the module and a ground connection of the insulation monitoring device is connected to the casing of the voltage source.

In this context, the electrically conductive casing serves as a ground reference point as in a battery, for example, or can serve as a reference point, e.g. realized as a module frame, for the ground potential in a photovoltaic plant.

A measuring signal is fed between the first connection and the ground connection as well as between the second connection and the ground connection using a signal generator arranged in the insulation monitoring device. The measuring signal is preferably realized as an AC measuring signal having a determined measuring signal frequency.

Each battery module or photovoltaic module comprises a leakage resistance and a leakage capacitance from the positive pole and the negative pole to the casing. The respective sizes of the leakage resistance (insulation resistance) and of the leakage capacitance are determined by the constructive design and the used materials of the individual modules and are in the high megaohm to gigaohm range or rather in the single-digit nanofarad range. The leakage resistances also determine the self-discharge and the real loss of the module.

The function of the insulation monitoring device can thus be advantageously used in order to already determine electrical parameters, such as the leakage resistance and the leakage capacitance, for both partial strings of the modules during the production process of the voltage source in sync with the assembly progress.

For this purpose, a first partial voltage of the module is captured and determined at the first connection after every addition of a module to the first partial string of the module and a second partial voltage of the module is captured and determined at the second connection after every addition of a module to the second partial string of the module.

As soon as a module has been added, a leakage resistance and a leakage capacitance are detected by using the measured first or second partial voltage of the module for the partial string of the module expanded by the newly added module.

For each addition of a module, the series connection, i.e. the partial string of the module, is expanded by a new module so that the currently detected leakage resistance of each partial string—and consequently the overall leakage resistance of the voltage source as well—becomes smaller since new leakage resistances arise parallel to the existing leakage resistances. Similarly, the currently detected leakage capacitance of each partial string—and consequently the overall leakage capacitance of the voltage source as well— increases with every newly added module.

In fault-free instances, a decreasing progression of the respective currently detected leakage resistance and an increasing progression of the currently detected leakage capacitance can therefore be observed with the progression of the production (adding of new modules).

Based on the detected leakage resistances, an insulation fault is signaled should the leakage resistance have dropped below a respective leakage resistance threshold value given for the progressing assembly conditions.

In this first fault instance, the detected leakage resistance does decrease as expected after adding a module but it does not drop below a given leakage resistance threshold value. It can therefore be presumed that an insulation fault has been caused by an unintentional electrical connection against the casing when the lastly added module was installed, e.g. in the form of a body contact or ground fault, or that the added module itself is faulty.

Furthermore, a line disruption is signaled should the leakage resistance not be decreased by adding a module and/or should the leakage capacitance not be increased by adding the module.

In this second fault instance, the currently detected leakage resistance does not decrease and the leakage capacitance does not increase as expected after another module has been installed so that it can be presumed that the module connection lines are faulty, e.g. that they comprise a line disruption.

Every time another module has been added, a test is carried out to determine whether a fault voltage is measured between the first connection and the second connection.

Since both the partial strings of the modules form two open partial systems, no voltage should be measured between the first connection and the second connection as long as the partial strings of the modules are not connected to form an overall system via the lastly installed module.

Not until after the lastly installed module has been installed will a voltage as high as the nominal voltage between the first connection and the second connection be available.

Should a voltage already be able to be measured between the first connection and the second connection while adding another module, this voltage can be construed as a fault voltage, which indicates an unintentional conductive connection between both partial strings of the modules and consequently a fault in the form of a "crossfault".

Should such a "crossfault" remain undiscovered, a short-circuit current, which could entail massive damage to the voltage source, would be set when adding the final module.

After adding the lastly installed module, a test is carried out to determine whether a nominal voltage is set between the first connection and the second connection.

Should the desired nominal voltage be able to be measured after all modules have been installed, it can then be presumed that all installed modules supply the required voltage and no "crossfaults" have occurred and consequently the production process has progressed without error.

The method according to the invention thus advantageously ensures that a line break, an insulation fault and a "crossfault" are prematurely identified and localized during the production process of the voltage source.

In another embodiment, an overall leakage impedance of the voltage source is detected.

Based on the knowledge of the leakage resistances and the leakage capacitances detected for each partial string of the module, it is useful to calculate an overall leakage impedance which is valid for the voltage source. The calculated overall leakage impedance represents a complex-valued size whose real part corresponds to an overall insulation fault resistance and whose imaginary part corresponds to an overall leakage capacity.

Furthermore, a module voltage is calculated for identifying a faulty module, said module voltage resulting from the partial voltage of the module and a voltage divider, which is formed by the leakage resistance and coupling and measuring resistances of the insulation monitoring device.

Advantageously, the faulty module is identified in the partial string of the module and/or in the close module string.

Should an insulation fault arise during installation of the module, the detected leakage resistance then corresponds to an insulation fault resistance. The circuit is closed via the insulation fault resistance and forms a voltage divider in conjunction with the known coupling and measuring resistances. From these resistances, a module voltage, which abuts against the modules installed between the first/second connection and the insulation fault location, can be measured using the partial voltage of the module. The calculated module voltage is therefore equal to or larger than the sum of the voltage generated by intact modules between the first/second connection and the insulation fault location. In awareness of a module nominal voltage specified for each module, the number of modules installed without error between the first/second connection and the insulation fault location can be determined, where-from the location of a faulty module can be detected in the open partial string of the module. It can be determined in an identified insulation fault, for example, that this insulation fault has arisen at the $n^{th}$ installed module should the calculated module voltage comprise the (n−1) module nominal voltages of the anterior module.

The calculation of the module voltage in the closed module string also enables identifying a wrongly installed module, i.e. determining an insulation location in the closed module string. This approach proves to be advantageous since faults can arise not only in the recently installed module but also in previously installed modules due to mechanical processing steps.

During installation, the connection between the first coupling branch and the first connection, the connection between the second coupling branch and the second connection and the connection between the ground connection of the insulation monitoring device and the casing of the voltage source are advantageously monitored in a voltage source, which comprises a first measuring connection and a second measuring connection.

It hast to be ensured in the mostly automated production process that the insulation monitoring device is properly connected to the voltage source. This can be ensured by monitoring the connection between the first and second connection as well as the casing (mass potential or ground potential).

Furthermore, the connection between the first coupling branch and the first connection and the connection between the second coupling branch and the second connection are each monitored by means of a conductor loop.

The conductor loop leads back to the first/second coupling branch of the insulation monitoring device starting from the ground connection of the insulation monitoring device via the first/second measuring connection of the voltage source and via the first/second connection of the voltage source. A current of an expected size flowing in the conductor loop signals an intact connection of the first/second connection to be monitored.

Preferably, a defined terminal element capacitance or a defined terminal element impedance is measured in the respective conductor loop.

In this embodiment, a defined terminal element capacitance of a known size or a defined terminal element impedance of a known size is inserted in the respective conductor loop and measured using the insulation monitoring device in each instance between the ground connection of the insulation monitoring device and the first/second measuring connection of the voltage source.

Should the measured terminal element capacitance/terminal element impedance correspond to the known value of the defined terminal element capacitance/terminal element impedance, a proper connection of the connection between the first/second coupling branch of the insulation monitoring device and the first/second connection of the voltage source can be presumed.

Only the terminal element capacitance (imaginary part of the terminal end impedance) can be inserted and measured instead of the complex-valued terminal element impedance with the advantage that no discharge current can flow via the terminal element resistance (real part of the terminal element impedance).

Furthermore, the connection between the ground connection and the casing of the voltage source can be monitored via a conductor loop, which is connected to the ground connection and to an additional ground connection of the insulation monitoring device carried out parallel to the ground connection.

Insulation monitoring devices known from the state of the art comprise an additional ground connection carried out parallel to the ground connection. Starting from the ground connection of the insulation monitoring device, a conductor loop closed via the casing of the voltage source is formed leading back towards the additional ground connection, by means of which the continuity of the connection of the ground connection can be tested.

In another embodiment, the method for monitoring more than two partial strings of the modules can be applied.

The method according to the invention is not limited to the monitoring of exactly two partial strings of the modules. An expansion through further signal paths carried out parallel having a coupling to further partial strings of the modules as well the determination of further leakage impedances are suitable to the purpose.

The object of the invention is further attained by a measuring arrangement. The measuring arrangement according to the invention comprises all structural features in order to carry out the method according to the invention for monitoring a production process of a voltage source in conjunction with the described advantageous effects.

For carrying out the method according to the invention, the measuring arrangement comprises an insulation monitoring device having a coupling circuit, whose first coupling branch is connected to the first connection in order to capture a first partial voltage of the module and whose second coupling branch of the coupling circuit is connected to the second connection in order to capture a second partial voltage of the module.

The insulation monitoring device further comprises a signal generator for feeding a measuring signal as well as a voltage measuring circuit, said signal generator being connected in series with the coupling circuit and a ground connection of the signal generator being connected to the casing of the voltage source and said voltage measuring circuit being connected to the coupling circuit on the inlet side and to a digital computing unit on the outlet side via a digital-analog converter in order to determine the first partial voltage of the module and the second partial voltage of the module.

The digital computing unit is configured for detecting a leakage resistance and a leakage capacitance for the first and the second partial string of the module after each module has been added, for signaling an insulation fault should the leakage resistance have dropped below a given leakage resistance threshold value after a module has been added, and for signaling a line disruption should the leakage resistance not have been decreased by adding a module or should the leakage capacitance not have been increased by adding a module. Furthermore, the digital computing unit is configured for testing whether a fault voltage and a nominal voltage is measured between the first connection and the second connection.

In further embodiments, the digital computing unit is configured for detecting an overall leakage impedance of the voltage source as well as for calculating a module voltage in order to identify a faulty module in the partial string of the module and/or in the closed module string.

Alternatively or additionally to the computational detection of the complex-valued overall leakage impedance in the digital computing unit, the insulation monitoring device comprises an impedance measuring circuit for detecting a complex-valued overall leakage impedance of the voltage source whose real part corresponds to an overall insulation fault resistance and whose imaginary part corresponds to an overall leakage capacitance.

Advantageously, a conductor loop for monitoring the connection between the first coupling branch and the first connection, for monitoring the connection between the second coupling branch and the second connection and for monitoring the connection between the ground connection of the insulation monitoring device and the casing of the source voltage is realized at a voltage source, which comprises a first measuring connection and a second measuring connection.

Establishing conductor loops, which each form a closed circuit in conjunction with the connection to be monitored, enables testing whether the insulation monitoring device is properly connected to the voltage source.

Preferably for this purpose, the conductor loop is guided back to the first/second coupling branch of the insulation monitoring device via the first/second measuring connection of the voltage source and via the first/second connection of the voltage source starting from the ground connection of the insulation monitoring device in order to monitor the connection between the first/second coupling branch and the first/second connection.

Preferably, the respective conductor loop comprises defined terminal element capacitances or defined terminal element impedances between the ground connection of the insulation monitoring device and the first/second measuring connection of the voltage source in order to monitor the connection between the first/second coupling branch and the first/second connection.

The value of the defined terminal element capacitances or the defined terminal element impedances are measured by the insulation monitoring device and compared to the known (actual) values. In the event of non-conformance, a connection fault can be presumed.

Furthermore, the conductor loop is guided back to an additional ground connection of the insulation monitoring device, which is carried out parallel to the ground connection, via the casing of the voltage source starting from the ground connection of the insulation monitoring device in order to monitor the connection between the ground connection of the insulation monitoring device and the casing of the voltage source.

The conductor loop realized thus serves for monitoring the casing connection and presumes that the insulation monitoring device comprises an additional ground connection carried out parallel to the ground connection according to the state of the art.

Further coupling branches carried out parallel for monitoring more than two partial strings of the modules prove to be purposeful to the invention, the voltage measuring circuit and the digital computing unit being configured for determining and evaluating further leakage impedances (leakage resistances and leakage capacitances).

BRIEF DESCRIPTION OF THE DRAWING FIGURES

Figure 2:
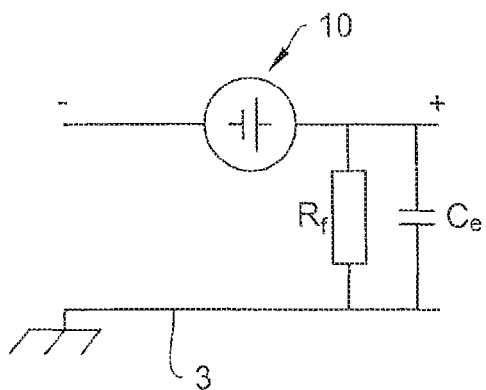
Figure 4:
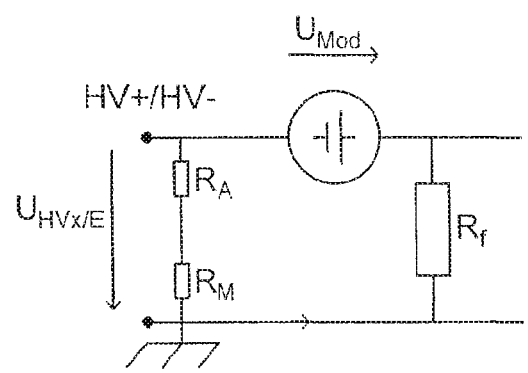
Figure 3:
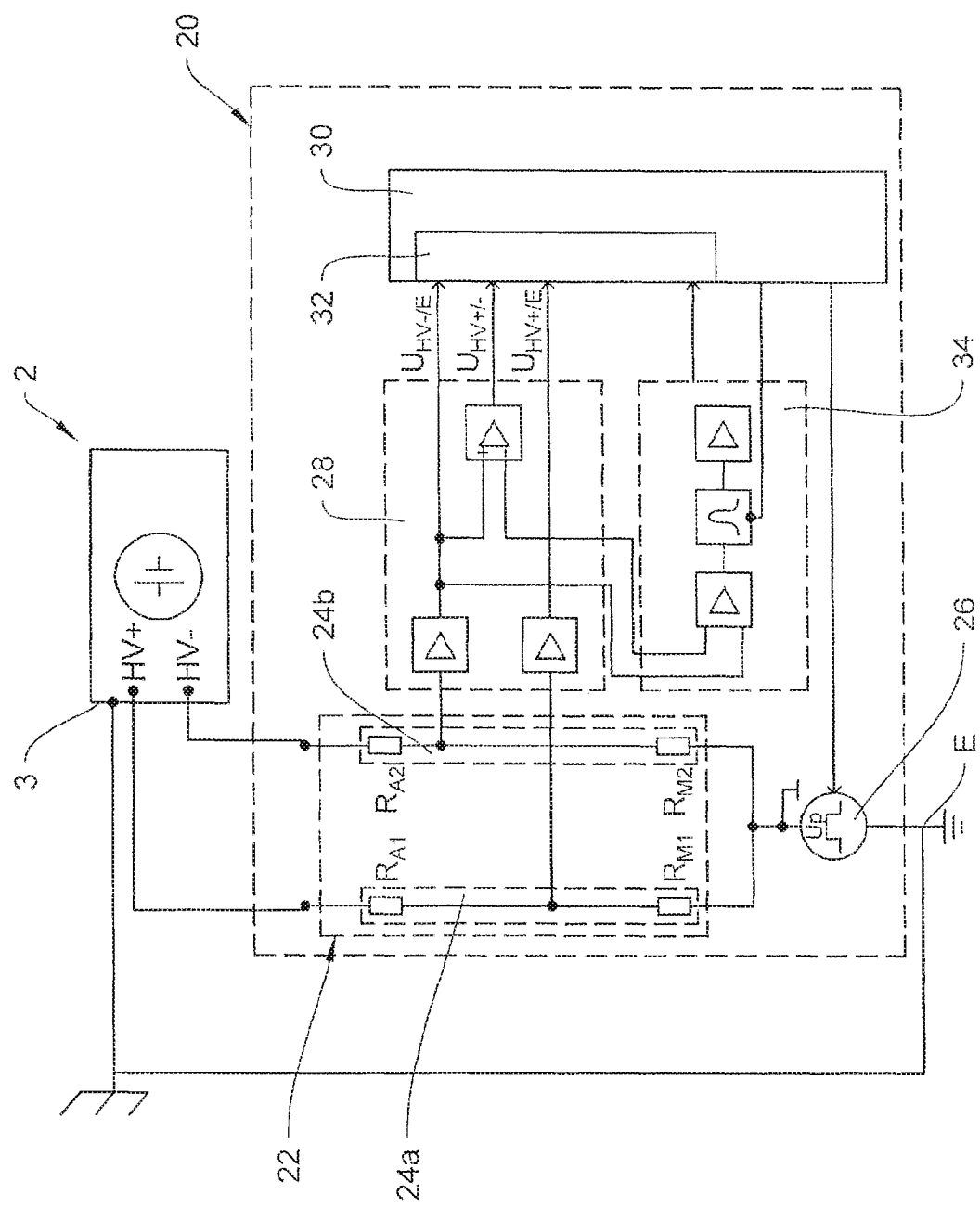
Figure 5:
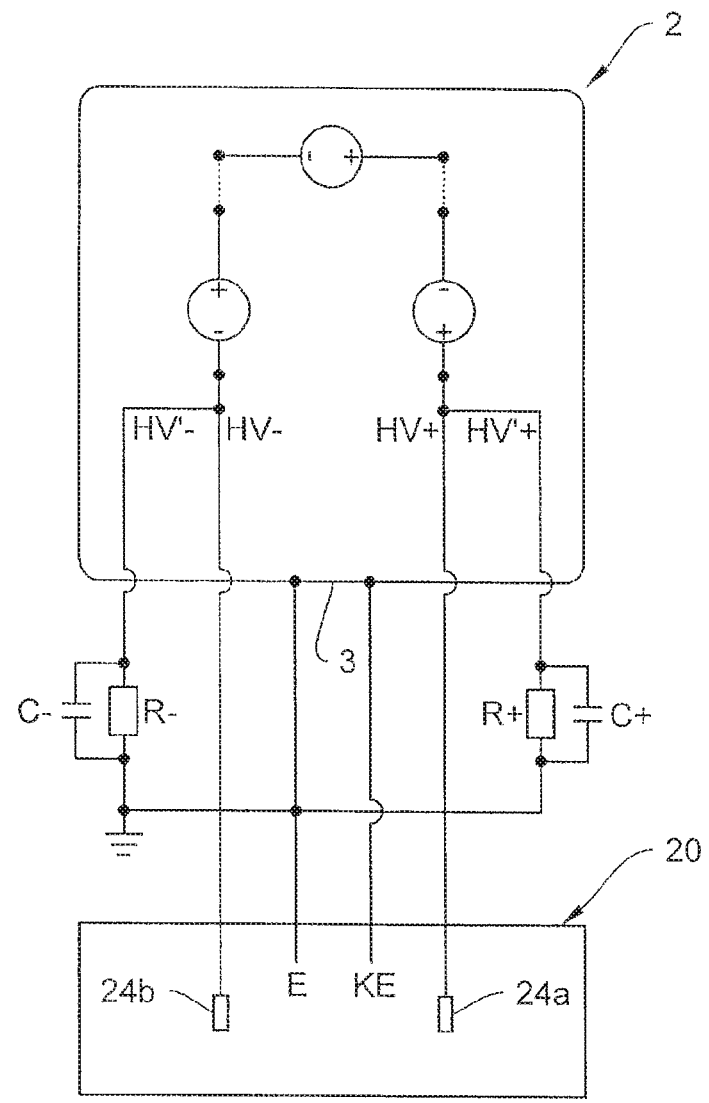

Further advantageous features of the embodiments can be derived from the following description and drawings, which describe a preferred embodiment of the invention by means of examples. In the following, FIG. 1 illustrates a voltage source having two partial strings of the modules, FIG. 2 illustrates a simplified circuit diagram of a module of the voltage source, FIG. 3 illustrates a schematic view of a measuring arrangement according to the invention having a voltage source and an insulation monitoring device, FIG. 4 illustrates a substitutional circuit diagram for detecting a module voltage, and FIG. 5 illustrates a measuring arrangement having terminal element impedances for monitoring connections.

DETAILED DESCRIPTION

In FIG. 1, the production process is first explained by means of the example of a modularly designed HV battery, said production process being based on an application of the method according to the invention and the measuring arrangement according to the invention.

The HV battery is illustrated as a voltage source 2 consisting of modules 6a to 6f, 8a to 8f, 10 arranged in two partial strings of the modules 4a, 4b in conjunction with a casing 3. Generally, any arbitrary number of modules 6a to 6f, 8a to 8f, 10 can be set up to form first and second partial strings of the modules 4a, 4b when applying the method, said first and said second partial string 4a, 4b being able to have a number of modules differing to each other as long as this is appropriate from a technical point of view and seems feasible. Insofar, the invention also comprises an asymmetric design of the two partial strings of the modules 4a, 4b as well as a design in which merely one partial string of the module (4a, 4b) is established.

During the production process of the voltage source 2, the individual modules 6a to 6f, 8a to 8f are set up step-by-step starting from a first connection HV+ and starting from a second connection HV−. The second module 6b is connected to the first module 6a of the first partial string of the module 4a and the second module 8b is connected to the first module 8a of the second partial string of the module 4b; subsequently, the third module pair 6c, 8c is added, etc. Two discrete, "growing" partial strings of the modules 4a and 4b are derived, which each form an ungrounded (power supply) system.

After adding the module pair 6f, 8f, the two open module strings 4a, 4b are connected by adding the lastly installed module 10 to form a closed module string. Not until then will a voltage be tapped between the first connection HV+ and the second connection HV−. When the modules 6a to 6f, 8a to 8f, 10 are installed and function without error, the voltage corresponds to the nominal voltage of the voltage source 2.

Furthermore, the following is illustrated in FIG. 1 as possible fault sources: a line break 12 between the modules 6a to 6f, 8a to 8f, 10 connected in series; a "crossfault" 14 between the partial strings of the modules 4a, 4b; and an insulation fault 16 between the modules 6a to 6f, 8a to 8f, 10 and the casing 3.

FIG. 2 illustrates a simplified circuit diagram of the module 10 of the voltage source 2 as a substitution for the installed modules 6a to 6f, 8a to 8f, 10. The module 10 comprises a leakage resistance Rf and a leakage capacitance $C_e$ against the casing 3.

Owing to the series connection of the modules 6a to 6f, 8a to 8f, 10, further parallel leakage paths to the casing 3 are derived after each addition of another module 6b to 6f, 8b to 8f, 10 (FIG. 1) so that the currently detected leakage resistance—after adding another module 6b to 6f, 8b to 8f, 10—decreases and the currently detected leakage capacitance increases.

By consulting and evaluating the currently detected leakage resistance and the currently detected leakage capacitance according to the invention for monitoring the production quality, possible insulation faults and line defects (line disruptions and "crossfaults") can be prematurely identified during the production process.

FIG. 3 illustrates a schematic view of a measuring arrangement according to the invention having the source voltage 2, to which an insulation monitoring device 20 is connected.

The insulation monitoring device 20 comprises a coupling circuit 22 having a first and a second coupling branch 24a, 24b having coupling resistances $R_{A1}$, $R_{A2}$ and measuring resistances $R_{M1}$, $R_{M2}$, a signal generator 26 connected in series to the coupling circuit 22 for feeding a measuring signal $U_P$, a voltage measuring circuit 28 as well as a digital computing unit 30 having a digital-analog converter 32.

Optionally, the insulation monitoring device 20 can comprise an impedance measuring circuit 34 for detecting an overall leakage impedance of the voltage source 2.

The first coupling branch 24a is connected to the first connection HV+ of the source voltage 2 and the second voltage branch 24b is connected to the second connection HV− of the voltage source 2. A ground potential E of the insulation monitoring device 20 is connected to the casing 3 of the voltage source 2.

The partial voltages of the modules $U_{HV+/E}$, $U_{HV-/E}$ abutting against the first and the second connection HV+, HV− are captured by means of the coupling circuit 22, in which the voltage measuring circuit 28 is determined and fed to the digital computing unit 30 via the digital-analog converter 32. In this location, the partial voltages of the modules $U_{HV+/E}$, $U_{HV-/E}$ are consulted for detecting the leakage resistance $R_f$ and the leakage capacitance $C_e$ by means of methods for digital signal processing (filtering).

Moreover, the voltage measuring circuit 28 can comprise a differential amplifier 29 for detecting a differential voltage $U_{HV+/-}$ from the two partial voltages of the modules $U_{HV+/E}$, $U_{HV-/E}$. The differential voltage $U_{HV+/-}$ is also sent to the digital computing unit 30 via the digital-analog converter 32.

FIG. 4 illustrates a substitutional circuit diagram for detecting a module voltage $U_{Mod}$ from the respectively detected partial voltage of the module $U_{Hv+/E}$, $U_{HV-/E}$ ($U_{HVx/E}$) and from the detected leakage resistance $R_f$ (insulation fault) as well as from known coupling and measuring resistances $R_A$, $R_M$ of the insulation monitoring device 20. The leakage resistance $R_f$ forms a voltage divider in conjunction with the coupling and measuring resistances $R_A$, $R_M$, a module voltage $U_{Mod}$ being able to be calculated according to the voltage divider and abutting against the modules installed between the first/second connection HV+/HV− and the insulation fault location:

$$U_{Mod}=U_{HVx/E}*[1+R_f/(R_A+R_M)].$$

In the same manner, a module voltage $U_{Mod}$ can be detected in a closed module string for one or several of the modules 6a to 6f, 8a to 8f, 10 so that a fault location identification, i.e. the identification of a faulty module, is possible in an open partial string of the module 4a, 4b as well as in a closed module string by comparing the calculated module voltage to a specified module nominal voltage.

FIG. 5 illustrates a measuring arrangement having terminal element impedances C+, R+; C−, R− for monitoring the connection between the first/second connection HV+/HV− as well as the connection between the casing 3 of the voltage source 2 and the insulation monitoring device 20.

Other than the first/second connection HV+/HV−, which is connected to the first/second coupling branch 24a/24b, the voltage source 2 comprises a first/second measuring connection HV'+/HV'−. A defined terminal element impedance C+, R+; C−, R− of a known size is switched between the first/second measuring connection HV'+/HV'− and the ground connection E of the insulation monitoring device 20 in each instance.

A conductor loop is consequently formed in each instance for monitoring the first/second connection HV+/HV− and leads back to the first/second coupling branch 24a/24b of the insulation monitoring device 20 via the respective terminal element impedance C+, R+ or C−, R−, via the first/second measuring connection HV'+/HV'− of the voltage source 2 and via the first/second connection HV+/HV− of the voltage source 2 starting from the ground connection E of the insulation monitoring device 20.

In order to monitor the connection of the ground connection E of the insulation monitoring device 20 having the casing 3 of the voltage source 2, an additional ground connection KE of the insulation monitoring device 20 carried out parallel to the ground connection E is used so that a conductor loop can be realized which leads back to the additional ground connection KE via the casing 3 starting from the ground connection E.

The invention claimed is:
1. A method for monitoring a production process of a voltage source (2), which consists of modules (6a to 6f, 8a to 8f, 10) connected in series and having an electrically conductive casing (3), said modules being set up step-by-step during the production process starting from a first connection (HV+) to form a first partial string of the module (4a) and starting from a second connection (HV−) to form a second partial string of the module (4b) and a lastly installed module (10) connecting both partial strings of the modules (4a, 4b) to each other so as to form a closed module string, comprising the method steps:
  connecting a first coupling branch (24a) of a coupling circuit (22) of an insulation monitoring device (20) to the first connection (HV+), connecting a second coupling branch (24b) of the coupling circuit (22) of the insulation monitoring device (20) to the second connection (HV−), and connecting a ground connection (E) of the insulation monitoring device (20) to the casing (3) of the voltage source (2), feeding a measuring signal (UP) between the first connection (HV+) and the ground connection (E) and between the second connection (HV−) and the ground connection (E), capturing and determining a first partial voltage of the module (UHV+/E) at the first connection (HV+) every time an additional module has been added to the first partial string of the module (4a), capturing and determining a second partial voltage of the module (UHV−/E) at the second connection (HV−) every time an additional module has been added to the second partial string of the module (4b), detecting a leakage resistance (Rf) every time any additional module has been added and detecting a leakage capacitance (Ce) for the partial strings of the modules (4a, 4b) to which the module was added, signaling an insulation fault (16) should the leakage resistance (Rf) drop below a given leakage resistance threshold value by adding the module, signaling a line disruption (12) should the leakage resistance (Rf) not have decreased by adding the module, signaling the line disruption (12) should the leakage capacitance (Ce) not have increased by adding the module, testing whether a fault voltage is measured between the first connection (HV+) and the second connection (HV−) every time any additional module has been added, testing whether a nominal voltage has been set between the first connection (HV+) and the second connection (HV−) every time the lastly installed module (10) has been added.

2. The method according to claim 1, characterized in that an overall leakage impedance of the voltage source (2) is detected.

3. The method according to claim 1, characterized in that a module voltage (UMod) is calculated for identifying a faulty module, said module voltage (UMod) being derived from the partial voltage of the module (UHV+/E, UHV−/E) and from a voltage divider formed by the leakage resistance (Rf) and coupling and measuring resistances (RA, RM) of the insulation monitoring device (20).

4. The method according to claim 3, characterized in that the faulty module is identified in the partial string of the module (4a, 4b).

5. The method according to claim 3, characterized in that the faulty module is identified in the closed module string.

6. The method according to claim 1, characterized in that in a voltage source (2) which comprises a first measuring connection (HV'+) and a second measuring connection (HV'−), the connection between the first coupling branch (24a) and the first connection (HV+) is monitored, the connection between the second coupling branch (24b) and the second connection (HV−) is monitored, and the connection between the ground connection (E) of the insulation monitoring device (20) and the casing (3) of the voltage source (2) is monitored.

7. The method according to claim 6, characterized in that the connection between the first coupling branch (24a) and the first connection (HV+) and the connection between the second coupling branch (24b) and the second connection (HV−) are each monitored using a conductor loop.

8. The method according to claim 7, characterized in that a defined terminal element capacitance (C+, C−) or a defined terminal element impedance (C+, R+; C−, R−) is measured in the respective conductor loop.

9. The method according to claim 6, characterized in that the connection between the ground connection (E) and the casing (3) of the voltage source (2) is monitored via a conductor loop, said conductor loop being connected to the ground connection (E) and to an additional ground connection (KE) of the insulation monitoring device (20) carried out parallel to the ground connection (E).

10. The method according to claim 1, characterized by an application of the method for monitoring more than two partial strings of the modules.

11. A measuring arrangement for monitoring a production process of a voltage source (2), which consists of modules (6a to 6f, 8a to 8f, 10) connected in series and having an electrically conductive casing (3), said modules being set up step-by-step during the production process starting from a first connection (HV+) to a first partial string of the module (4a) and starting from a second connection (HV−) to a second partial string of the module (4b) and a lastly installed module (10) connecting both partial strings of the modules (4a, 4b) to each other to form a closed module string, having an insulation monitoring device (20), which comprises: a coupling circuit (22), a first coupling branch (24a) of the coupling circuit (22) being connected to the first connection (HV+) for capturing a first partial voltage of the module (UHV+/E), a second coupling branch (24b) of the coupling circuit (22) being connected to the second connection (HV−) for capturing a second partial voltage of the module (UHV−/E); a signal generator (26) for feeding a measuring signal (UP), said signal generator (26) being connected in series with the coupling circuit (22) and a ground connection (E) of the signal generator (26) being connected to the casing (3) of the voltage source (2); a voltage measuring circuit (28), said voltage measuring circuit (28) being connected to the coupling circuit (22) on the inlet side and to a digital computing unit (30) on the outlet side via a digital-analog converter (32) in order to determine the first partial voltage of the module (UHV+/E) and the second partial voltage of the module (UHV−/E), said computing unit (30) being configured for detecting a leakage resistance (Rf) and a leakage capacitance (Ce) for the first and the second partial strings of the modules (4a, 4b) every time an additional module has been added, for signaling an insulation fault (16) should the leakage resistance (Rf) have dropped below a given leakage resistance threshold value by adding a further module, and for signaling a line disruption (12) should the leakage resistance (Rf) should not have decreased by adding a further module or should the leakage capacitance (Ce) should not have increased by adding a module and being configured for testing whether a fault voltage and a nominal voltage is measured between the first connection (HV+) and the second connection (HV−).

12. The measuring arrangement according to claim 11, characterized in that the digital computing unit (30) is configured for detecting an overall leakage impedance of the voltage source (2).

13. The measuring arrangement according to claim 11, characterized in that the insulation monitoring device (20) comprises an impedance measuring circuit (34) for detecting an overall leakage impedance of the voltage source (2).

14. The measuring arrangement according to claim 11, characterized in that the digital computing unit (30) is configured for calculating a module voltage (UMod) in order to identify a faulty module in the partial strings of the module (4a, 4b) and/or in the closed module string.

15. The measuring arrangement according to claim 11, characterized in that in a voltage source (2), which comprises a first measuring connection (HV'+) and a second measuring connection (HV'−), a conductor loop is realized for monitoring the connection between the first coupling branch (24a) and the first connection (HV+), for monitoring the connection between the second coupling branch (24b) and the second connection (HV−), and for monitoring the connection between the ground connection (E) of the insulation monitoring device (20) and the casing (3) of the voltage source (2), respectively.

16. The measuring arrangement according to claim 15, characterized in that in order to monitor the connection between the first/second coupling branch (24a, 24b) and the first/second connection (HV+, HV−), the conductor loop is guided back to the first/second coupling branch (24a, 24b) of the insulation monitoring device (20) via the first/second measuring connection (HV'+, HV'−) of the voltage source (2) and via the first/second connection of the voltage source (2) starting from the ground connection (E) of the insulation monitoring device (20).

17. The measuring arrangement according to claim 16, characterized in that the respective conductor loop for monitoring the connection between the first/second coupling branch (24a, 24b) and the first/second connection (HV+, HV−) comprises defined terminal element capacitances (C+, C−) or defined terminal element impedances (C+, R+; C−, R−) between the ground connection (E) of the insulation monitoring device and the first/second measuring connection (HV'+, HV'−) of the voltage source (2).

18. The measuring arrangement according to claim 11, characterized in that the conductor loop for monitoring the connection between the ground connection (E) of the insulation monitoring device (20) and the casing (3) of the voltage source (2) is guided back to an additional ground connection (KE) of the insulation monitoring device (20), which is carried out parallel to the ground connection (E), via the casing (3) of the voltage source (2) starting from the ground connection (E) of the insulation monitoring device (20).

19. The measuring arrangement according to claim 11, characterized by further coupling branches, which are carried out parallel to each other, for monitoring more than two partial strings of the modules, the voltage measuring circuit (28) and the digital computing unit (30) being configured for determining and evaluating further leakage impedances.

* * * * *